(12) United States Patent
Chong et al.

(10) Patent No.: US 6,544,863 B1
(45) Date of Patent: Apr. 8, 2003

(54) METHOD OF FABRICATING SEMICONDUCTOR WAFERS HAVING MULTIPLE HEIGHT SUBSURFACE LAYERS

(75) Inventors: John M. Chong, Santa Barbara, CA (US); Paul Waldrop, Ithaca, NY (US); Tim Davis, Trumansburg, NY (US); Scott Adams, Ithaca, NY (US)

(73) Assignee: Calient Networks, Inc., San Jose, CA (US)

( * ) Notice: Subject to any disclaimer, the term of this patent is extended or adjusted under 35 U.S.C. 154(b) by 0 days.

(21) Appl. No.: 09/934,783

(22) Filed: Aug. 21, 2001

(51) Int. Cl.⁷ .................. H01L 21/46; H01L 21/302
(52) U.S. Cl. .................. 438/455; 438/456; 438/457; 438/458; 438/459; 438/718; 216/2
(58) Field of Search ................ 438/455–459, 438/689, 718, 740, 745, 752, 753; 257/642; 216/2

(56) References Cited

U.S. PATENT DOCUMENTS

| | | | |
|---|---|---|---|
| 3,493,820 A | 2/1970 | Rosvold | |
| 4,104,086 A | 8/1978 | Bondur et al. | |
| 4,365,863 A | 12/1982 | Broussaud | |
| 4,421,381 A | 12/1983 | Ueda et al. | |

(List continued on next page.)

FOREIGN PATENT DOCUMENTS

| | | |
|---|---|---|
| DE | 4224601 A1 | 1/1994 |
| DE | 19757181 A1 | 12/1997 |
| DE | 19800745 A1 | 1/1998 |
| EP | 0 834759 A2 | 4/1998 |
| EP | 0 980014 A1 | 2/2000 |
| EP | 1 120677 A2 | 8/2001 |
| GB | 2 175 705 A | 12/1986 |
| GB | 2 239 101 A | 6/1991 |
| GB | 2 275 787 A | 9/1994 |
| JP | 60-107017 | 6/1985 |
| JP | 5-107485 A | 4/1993 |
| JP | 6-180428 | 6/1994 |
| WO | WO 94/18697 | 8/1994 |
| WO | WO 97/04283 | 2/1997 |
| WO | WO 99/36941 | 7/1999 |
| WO | WO 99/36948 | 7/1999 |
| WO | WO 99/67666 | 12/1999 |
| WO | WO 01/33898 A2 | 5/2001 |

OTHER PUBLICATIONS

Robert E. Mihailovich, Z. L. Zhang, K. A. Shaw, and Noel C. MacDonald, "Single–Crystal Silicon Torsional Resonators." School of Electrical Engineering, Cornell University, Ithaca, NY 14853, pp. 184–188, IEEE (Feb. 1993).

M.T.A. Saif and N. C. MacDonald, "Planarity of Large MEMS," Journal of Microelectromechanical Systems, 5, 79–97 (1996).

W.–H. Juan and S.W. Pang, "High–aspect–ratio Si Vertical Micromirror Arrays for Optical Switching," Journal of MicroElectroMechanical Systems, 7, 207, –213 (1998).

(List continued on next page.)

Primary Examiner—Kamand Cuneo
Assistant Examiner—Lisa Kilday
(74) Attorney, Agent, or Firm—Blakely, Sokoloff, Taylor & Zafman LLP

(57) ABSTRACT

A method for fabricating semiconductor wafers as multiple-depth structure (i.e., having portions of varying height). The method includes patterning a first substrate and bonding a second substrate to the first. This process creates a subsurface patterned layer. Portions of the second substrate may then be etched, exposing the subsurface patterned layer for selective processing. For example, the layered structure may then be repeatedly etched to produce a multiple depth structure. Or, for example, exposed portions of the first substrate may have material added to them to create multiple-depth structures. This method of fabrication provides substantial advantages over previous methods.

13 Claims, 4 Drawing Sheets

U.S. PATENT DOCUMENTS

| | | |
|---|---|---|
| 4,509,249 A | 4/1985 | Goto et al. |
| 4,519,128 A | 5/1985 | Chesebro et al. |
| 4,553,436 A | 11/1985 | Hansson |
| 4,571,819 A | 2/1986 | Rogers et al. |
| 4,598,585 A | 7/1986 | Boxenhorn |
| 4,654,663 A | 3/1987 | Alsenz et al. |
| 4,670,092 A | 6/1987 | Motamedi |
| 4,688,069 A | 8/1987 | Joy et al. |
| 4,706,374 A | 11/1987 | Murakami |
| 4,784,720 A | 11/1988 | Douglas |
| 4,838,631 A | 6/1989 | Chande et al. |
| 4,851,080 A | 7/1989 | Howe et al. |
| 4,855,017 A | 8/1989 | Douglas |
| 4,876,217 A | 10/1989 | Zdebel |
| 4,922,756 A | 5/1990 | Henrion |
| 4,932,745 A | 6/1990 | Blonder |
| 5,016,072 A | 5/1991 | Greiff |
| 5,068,203 A | 11/1991 | Logsdon et al. |
| 5,083,857 A | 1/1992 | Hornbeck |
| 5,095,752 A | 3/1992 | Suzuki et al. |
| 5,097,354 A | 3/1992 | Goto |
| 5,121,180 A | 6/1992 | Beringhause et al. |
| 5,126,812 A | 6/1992 | Greiff |
| 5,172,262 A | 12/1992 | Hornbeck |
| 5,198,390 A | 3/1993 | MacDonald et al. |
| 5,203,208 A | 4/1993 | Bernstein |
| 5,226,321 A | 7/1993 | Varnham et al. |
| 5,235,187 A | 8/1993 | Arney et al. |
| 5,287,082 A | 2/1994 | Arney et al. |
| 5,316,979 A | 5/1994 | MacDonald et al. |
| 5,393,375 A | 2/1995 | MacDonald et al. |
| 5,397,904 A | 3/1995 | Arney et al. |
| 5,399,415 A | 3/1995 | Chen et al. |
| 5,426,070 A | 6/1995 | Shaw et al. |
| 5,427,975 A | 6/1995 | Sparks et al. |
| 5,428,259 A | 6/1995 | Suzuki |
| 5,444,566 A | 8/1995 | Gale et al. |
| 5,449,903 A | 9/1995 | Arney et al. |
| 5,454,906 A | 10/1995 | Baker et al. |
| 5,483,158 A | 1/1996 | van Heteren et al. |
| 5,488,862 A | 2/1996 | Neukermans et al. |
| 5,501,893 A | 3/1996 | Laermer et al. |
| 5,524,153 A | 6/1996 | Laor |
| 5,536,988 A | 7/1996 | Zhang et al. |
| 5,563,343 A | 10/1996 | Shaw et al. |
| 5,583,373 A | 12/1996 | Ball et al. |
| 5,610,335 A | 3/1997 | Shaw et al. |
| 5,611,888 A | 3/1997 | Bosch et al. |
| 5,611,940 A | 3/1997 | Zettler |
| 5,628,917 A | 5/1997 | MacDonald et al. |
| 5,629,790 A | 5/1997 | Neukermans et al. |
| 5,637,189 A | 6/1997 | Peeters et al. |
| 5,645,684 A | 7/1997 | Keller |
| 5,670,881 A | 9/1997 | Arakawa et al. |
| 5,673,139 A | 9/1997 | Johnson |
| 5,703,728 A | 12/1997 | Smith et al. |
| 5,719,073 A | 2/1998 | Shaw et al. |
| 5,726,073 A | 3/1998 | Zhang et al. |
| 5,759,913 A | 6/1998 | Fulford, Jr. et al. |
| 5,770,465 A | 6/1998 | MacDonald et al. |
| 5,798,557 A | 8/1998 | Salatino et al. |
| 5,804,084 A | 9/1998 | Nasby et al. |
| 5,846,849 A | 12/1998 | Shaw et al. |
| 5,847,454 A | 12/1998 | Shaw et al. |
| 5,853,959 A * | 12/1998 | Brand et al. ................ 430/320 |
| 5,869,916 A | 2/1999 | Suzuki et al. |
| 5,907,425 A | 5/1999 | Dickensheets et al. |
| 5,915,168 A | 6/1999 | Salatino et al. |
| 5,920,417 A | 7/1999 | Johnson |
| 5,933,746 A | 8/1999 | Begley et al. |
| 5,943,157 A | 8/1999 | Florence et al. |
| 5,969,848 A | 10/1999 | Lee et al. |
| 5,998,816 A | 12/1999 | Nakaki et al. |
| 5,998,906 A | 12/1999 | Jerman et al. |
| 5,999,303 A | 12/1999 | Drake |
| 6,000,280 A | 12/1999 | Miller et al. |
| 6,020,272 A | 2/2000 | Fleming |
| 6,028,690 A | 2/2000 | Carter et al. |
| 6,044,705 A | 4/2000 | Nuekermans et al. |
| 6,072,617 A | 6/2000 | Henck |
| 6,075,639 A | 6/2000 | Kino et al. |
| 6,097,858 A | 8/2000 | Laor |
| 6,097,860 A | 8/2000 | Laor |
| 6,101,299 A | 8/2000 | Laor |
| 6,121,552 A | 9/2000 | Brosnihan et al. |
| 6,137,926 A | 10/2000 | Maynard |
| 6,201,631 B1 | 5/2001 | Greywall |
| 6,229,640 B1 | 5/2001 | Zhang |
| 6,239,473 B1 | 5/2001 | Adams et al. |
| 6,253,001 B1 | 6/2001 | Hoen |
| 6,262,827 B1 | 7/2001 | Ueda et al. |

OTHER PUBLICATIONS

Rob Legtenberg, et al., "Comb–drive actuators for large displacements," Journal of Micromechaniss and Microengineering, vol. 6, No. 2, pp. 320–329, Jun. 1996.

Chris S.B. Lee, Sejin Han, and Noel C. MacDonald, "Single Crystal Silicon (SCS) XY–Stage Fabricated by DRIE and IR alignment," MEMS 2000: The Thirteenth Annual International Conference on Micro Electro Mechanical Systems, pp. 28–33 (Jan. 23–27, 2000).

Chris S.B. Lee, Russell Y. Webb, John M. Chong, and Noel C. MacDonald, "Single Crystal Silicon (SCS) MircroMIrror Arrays using Deep Silicon Etching and IR Alignment," MEMS 2000: The Thirteenth Annual International Conference on Micro Electro Mechanical Systems, pp. 441–448 (Jan. 23–27, 2000).

David A. Koester, Ramaswamy Mahadevan, Alex Shishkoff, and Karen W. Markus, "MUMPs Design Handbook," Version 4.0, Cronos Integrated Microsystems, Research Triangle Park, NC 27709, pp. 1–37 (May 1999).

Russell Y. Webb, Scott G. Adams, and Noel C. MacDonald, "Suspended Thermal Oxide Trench Isolation for SCS MEMS." SPIE vol. 3519, Boston, MA, pp. 196–199 (Nov. 1998).

Seung Chris B. Lee, "Two–Depth, Single Crystal Silicon Microelectromechanical Systems." A Dissertation Presented to the Faculty of the Graduate School of Cornell University in Partial Fulfillment of the Requirements for the Degree of Doctor of Philosophy, (Jan. 2000).

Leslie A. Field, Diane L. Burriesci, Peter R. Robrish, and Richard C. Ruby, "Micromachined 1 x2 Optical–Fiber Switch," Sensors and Actuators A, 53, pp. 311–315, (1996).

Larry J. Hornbeck, "Digital Light Proecssing for High–Brightness, High–Resolution Applications," SPIE vol. 3013, San Jose, CA, pp. 27–40 (Feb. 1997).

Noel C. MacDonald, "SCREAM MicroElectroMechanical Systems." Microelectronic Engineering, 32, pp. 49–73 (1996).

Ming C. Wu, "MEMS for Optical and RF Applications." UCLA Extension, Department of Engineering, Information Systems and Technical Management, Engineering: 823.52, Nov. 1–3, 1999.

Wolfgang Hofmann, Chris S. Lee, and Noel C. MacDonald, Monolithic Three–Dimensional Single–Crystal Sllicon Microelectromechanical Systems, Sensors and Materials, vol. 10, No. 6, pp. 337–350 (1998).

William C. Tang, Martin G. Lim, and Roger T. Howe, "Electrostatic Comb Drive Levitation and Control Method" Journal of Microelectromechanical Systems, vol. 1, No. 4, pp. 170–178 (Dec. 1992).

M.C. Wu, L.–Y Lin, S.–S. Lee, and K.S.J. Pister, "Micromachined Free–Space Integrated Micro–Optics," Sensors and Actuators A, 50, pp. 127–134 (1995).

Joseph E. Ford, Vladimir A. Aksyuk, David J. Bishop, and James A. Walker, "Wavelength Add–Drop Switching Using Tilting Micromirrors," Journal of Lightwave Technology, vol. 17, No. 5, pp. 904–911 (May 1999).

Cornel Marxer and Nicolaas F. de Rooij, "Micro–Opto–Mechanical 2 ×2 Switch for Single–Mode Fibers Based on Plasma–Etched Silicon Mirror and Electrostatic Actuation," Journal of Lightwave Technology, vol. 17, No. 1, pp. 2–6 (Jan. 1999).

Timothy J. Broshnihan, James M. Bustillo, Albert P. Pisano & Roger T. Howe, "Embedded Interconnect & Electrical Isolation for High–Aspect–Ratio, SOI Inertial Instruments," Berkeley Sensor & Actuator Sensor, pp. 637–640, Transducers '97, 1997 International Conference on Solid–State Sensors and Actuators (Chicago, Jun. 16–19, 1997).

Janusz Bryzek, Kurt Petersen, & Wendell McCulley, "Micromachines on the March," IEEE Spectrum, pp. 20–31 (May 1994).

Wolfgang Kuehnel and Steven Sherman, "A Surface Micromachined Silicon Acclerometer with On–Chip Detection Circuitry," Sensors and Actuators A 45, pp. 7–16 (1994).

Lynn Michelle Roylance and James B. Angell, "A Batch–Fabricated Silicon Accelerometer," IEEE Transactions on Electron Devices, vol. Ed–26, No. 12, pp. 1911–1917 (Dec. 1979).

Kevin A. Shaw, et al., "SCREAM I: A Single Mask, Single–Crystal Silicon, Reactive Ion Etching Process for Microelectromechanical Structures," Sensors and Actuators A, 40 pp. 63–70 (1994).

Toshiki Hirano, et al., "Design, Fabrication, and Operation of Submicron Gap Comb–Drive Microactuators," J. of Microelectromechanical Systems, vol. 1, No. 1, pp. 52–59, (Mar. 1992).

V.P. Jaecklin. et al., "Comb Actuators for XY–Microstages," Sensors and Actuators, A, 39, pp. 83–89 (1993).

Susanne C. Arney and Noel C. MacDonald, et al., "Formation of Submicron Silicon–On–Insulator Sructures by Lateral Oxidation of Substrate–Slicon Islands," J. Vac. Sci. Technol. B vol. 6 No. 1, pp. 341–345, (Jan./Feb. 1988).

"Lucent's New All–Optical Router Uses Bell Labs Microscopic Mirrors," Bells Labs press release, pp. 1–4, Nov. 10, 1999. http://www.bell–labs.com/news/1999/november/10/1.html.

M. Adrian Michalicek, Wenge Zhang, Kevin F. Harsh, Victor M. Bright, and Y.C. Lee, "Micromirror Arrays Fabricated by Flip–Chip Assembly," Part of the SPIE Conference on Miniaturizes Systems with Micro–Optics and MEMs, Santa Clara, SPIE vol. 3878, pp. 68–79 (Sep. 1999).

Chris Seung–Bok Lee, Sejin Han, Noel C. MacDonald, "Mulitple Depth, Single Crystal Silicon MicroActuators for Large Displacement Fabricated by Deep Reactive Ion Etching," Solid–State Sensor and Actuator Workshop, Hilton Head Island, SC, pp. 45–50 (Jun. 8–11, 1998).

* cited by examiner

METHOD OF FABRICATING SEMICONDUCTOR WAFERS HAVING MULTIPLE HEIGHT SUBSURFACE LAYERS

FIELD OF THE INVENTION

This invention relates generally to the use of semiconductor substrates and more specifically to an improved method of fabricating a substrate having regions of varying height.

BACKGROUND OF THE INVENTION

Semiconductor wafers can be formed in many shapes for a variety of uses. One important practical application for semiconductor substrates is in the fabrication of micro-electro-mechanical systems (MEMS) in the form of electrostatic actuators. In such devices and in other applications, it may be useful to have regions of the semiconductor with varying heights. Design flexibility is significantly increased by the ability to shape the semiconductor wafer. For example, when a fabricated silicon wafer is used as the substrate of an electrostatic actuator the electric field force can vary substantially due to the shape of the substrate.

Using current semiconductor fabrication processes, it is difficult to form a substrate having regions of varying height. Typically a semiconductor wafer, for example a silicon wafer, is fabricated through a process that includes deposition, masking, and etching. Deposition may include depositing a protective layer on top of the silicon substrate. The protective layer may be, for example, silicon dioxide, silicon nitride, a polymer, or other like material. The protective layer may be deposited or may be formed upon the substrate.

Masking includes placing a pattern upon the protective layer in a stencil-like fashion. The wafer is then selectively etched through an etching process that may be, for example, a reactive ion etching process or a wet chemical etching process, or some other etching process known in the art. The selective etching of the silicon wafer creates a structure as determined by the pattern as described above.

Typically the wafer is etched straight down. This process limits the design flexibility in terms of the shape of the fabricated wafer. That is, the three-dimensional structure created is a projection of the pattern. Typically, fabrication of wafers is done as a batch process. This allows a thousand, or more, devices to be fabricated at a time from a single large wafer. Throughout the process there is no physical machining of the wafer surface, no tools touch the wafer. It is not practical to address each device on the wafer, instead the entire wafer is subjected to the process described above. The sequence of operations of the process must be tailored to produce the desired device shape.

Using the method as described above it is difficult to vary the size of portions of the wafer. Methods such as undercutting or inverting the wafer provide a limited ability to vary the height of portions of the substrate, thus providing only minimal increase in design flexibility.

SUMMARY OF THE INVENTION

A method is disclosed for creating a subsurface patterned layer and exposing the subsurface patterned layer to further processing. A first protective layer is formed upon a first substrate layer. The first protective layer is then selectively patterned such that patterned portions of the first protective layer are reduced. A second substrate layer is then bonded to the first protective layer such that a subsurface patterned layer is formed. A second protective layer is formed upon the second substrate layer and the second protective layer is then selectively patterned such that portions of the second substrate layer are exposed. The exposed portions of the second substrate layer are then etched such that the subsurface patterned layer is exposed.

Other features and advantages of the present invention will be apparent from the accompanying drawings, and from the detailed description, that follows below.

BRIEF DESCRIPTION OF THE DRAWINGS

The present invention is illustrated by way of example, and not limitation, by the figures of the accompanying drawings in which like references indicate similar elements and in which.

DETAILED DESCRIPTION

A method is described for fabricating semiconductor wafers having portions of varying height. The method includes patterning a semiconductor substrate and bonding to it one or more other patterned substrates creating a subsurface patterned layer. The subsurface patterned layer is then exposed for selective processing. For example, the layered structure may then be repeatedly etched to produce a multiple depth structure. This method of fabrication provides substantial advantages over previous methods.

An intended advantage of one embodiment of the present invention is to provide multiple depth semiconductor structures for use in MEMS devices. Another intended advantage is to provide and simplify the fabrication process of high resolution multiple depth structures. Another intended advantage is to allow the masking process for a subsurface feature to be effected upon a planar surface. Another intended advantage is to provide reliable bonding of semiconductor wafer layers. Another intended advantage is provide more uniform structures through the use of stop layers to address non-uniformities in the fabrication process.

As described in more detail below, one embodiment of the present invention is a method of fabricating semiconductor substrates having portions of varying height, i.e., multiple depth structures.

Figure 1:
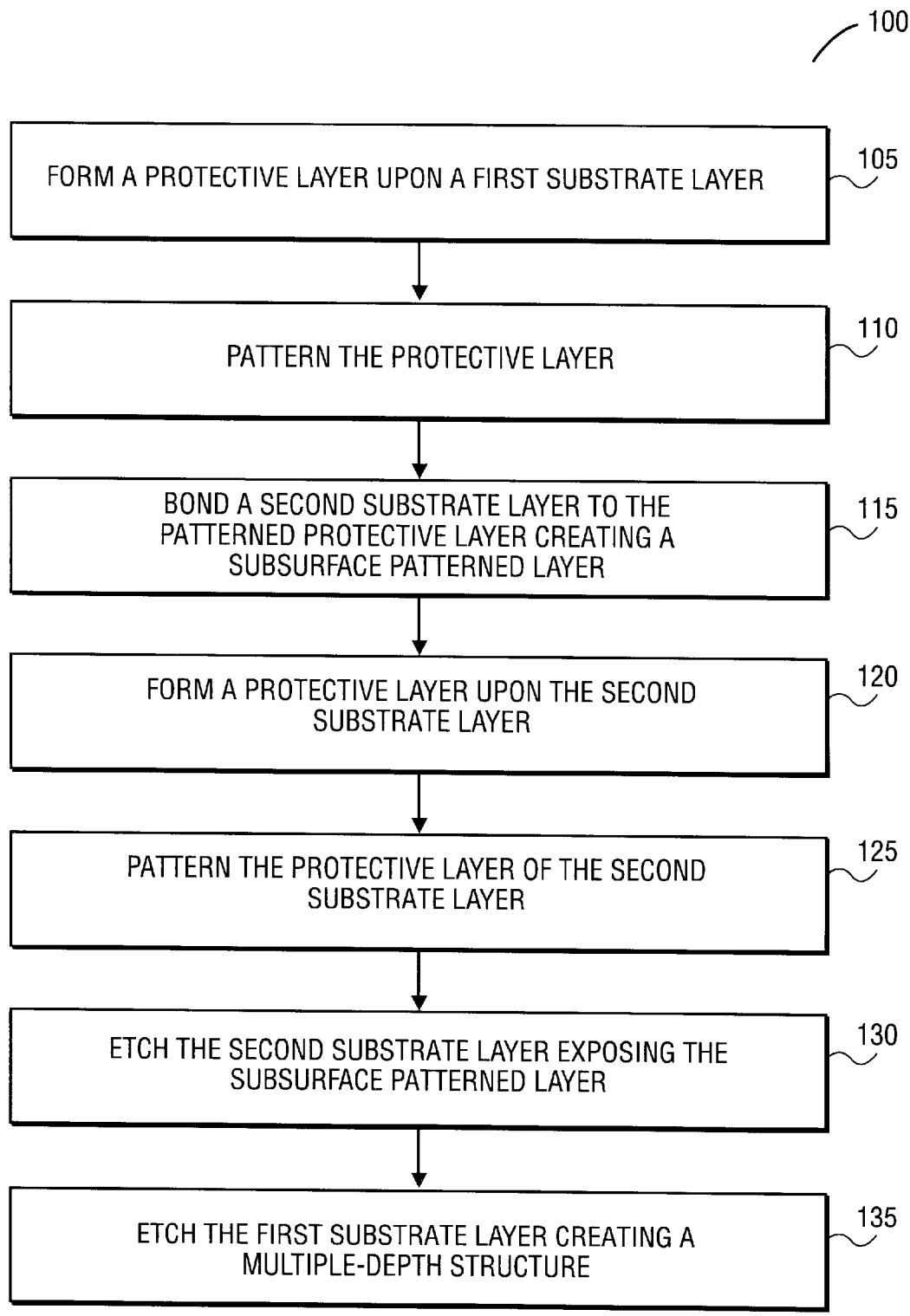
FIG. 1 illustrates a process flow diagram according to one embodiment of the present invention.

FIG. 1 is a process flow diagram according to one embodiment of the present invention. The process 100, shown in FIG. 1 begins at operation 105 in which a protective layer is formed or deposited upon a first substrate layer. In a preferred embodiment the substrate may be a semiconductor wafer, for example, a silicon wafer. In alternative embodiments the substrate material may be some other semiconductor material such as gallium arsenide, or may be glass or metal. In a preferred embodiment, the protective layer may be an oxide layer formed upon the substrate layer.

At operation 110 the protective layer is selectively patterned. The pattern depends upon the desired application. In a preferred embodiment the patterning may be accomplished through the deposition of a photosensitive layer that is then selectively exposed to light. The areas exposed to light are then removed through a development process. This leaves an opening in the photosensitive layer exposing a portion of the protective layer. The exposed portion of the protective layer is then etched (for example by a reactive ion etching process) thereby reducing the protective layer thickness in the exposed regions.

At operation 115 a second substrate layer is bonded to the patterned protective layer of the first substrate. In an alternative embodiment the second substrate layer may be deposited upon the first substrate layer. The second substrate layer may be the same material as the first substrate or may be another material or combination of material. A protective layer is formed or deposited upon the second substrate layer at operation 120 and the second substrate is selectively patterned at operation 125.

At operation 130 the second substrate layer is etched. The etching may be accomplished using one or more standard etching processes well known to those skilled in the art. For example, the etching may be a dry etching process such as reactive ion etching (RIE), or could be a wet chemical etching process. The patterned protective layer protects the substrate material below it and the exposed material is etched away. The etching of the second substrate layer exposes the patterned protective layer of the first substrate layer.

At operation 135 the patterned protective layer of the first substrate is subjected to etching. This may involve a two-part etching process. A first etch may be used to remove any residual protective material (e.g., oxide) from the patterned areas. A second etch may then be used to etch the exposed substrate material of the first substrate layer thus creating a structure of varying height.

In an alternative embodiment, the top side and back side of the second substrate is patterned to provide better alignment between the two patterned layers.

Figure 2A:
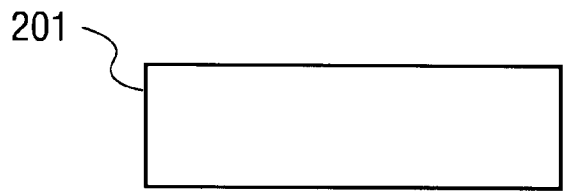
FIGS. 2A through 2I illustrate the fabrication of a multiple depth structure according to one embodiment of the present invention.

FIGS. 2A through 2I illustrate the fabrication of a multiple depth structure according to one embodiment of the present invention. FIG. 2A shows a substrate 201 that may be a semiconductor (e.g., silicon). The substrate may be other materials as well, such as glass or metal.

Figure 2B:
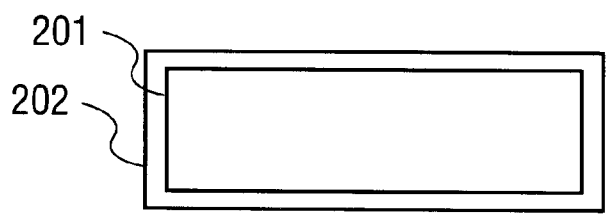

FIG. 2B shows the addition of a protective layer 202. In a preferred embodiment this protective layer may be a layer of silicon dioxide formed by subjecting a silicon substrate to heat and gases. In alternative embodiments the protective layer 202 may be other materials, and may be deposited upon the substrate 201. The protective layer 202 may be chosen for its mechanical or electrical characteristics depending upon the application.

Figure 2C:
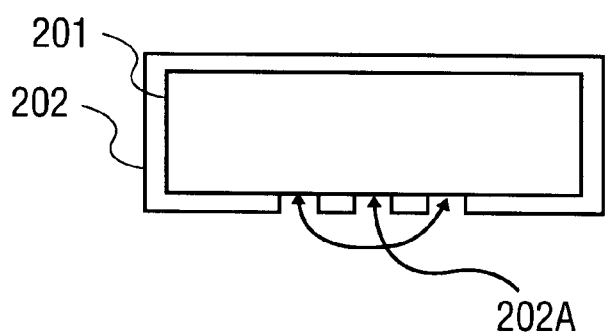

FIG. 2C shows the protective layer 202 after a patterning and etching process. Patterning may typically be accomplished by applying a photosensitive layer, not shown, to protective layer 202. A stencil of the desired pattern may then be placed upon the photosensitive layer and light is applied. The material exposed to the light is then typically removed using an etching process. The stenciled pattern is impervious to the etching thereby leaving a stenciled pattern on protective layer 202. In a preferred embodiment, a thin portion 202a of protective layer 202 remains after the etching process. This thin portion 202a may function as an etch stop as described below in reference to FIG. 2G. In an alternative embodiment thin portions 202a may not used, leaving the substrate layer 201 exposed.

Figure 2D:
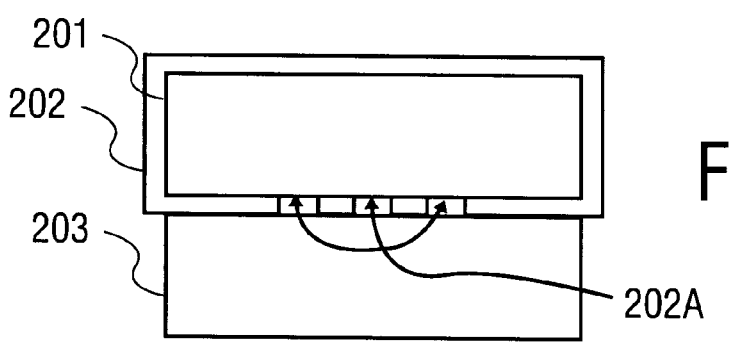

FIG. 2D shows the addition to the structure of a substrate layer 203. The substrate layer 203 may be the same material as the substrate layer 201, or may be a different material. Substrate layer 203 is bonded to the patterned side of protective layer 202. This creates a patterned subsurface layer that can be selectively processed when it is later exposed as described below. Protective layer 202 has a relatively planar surface that allows for a reliable bonding process.

Figure 2E:
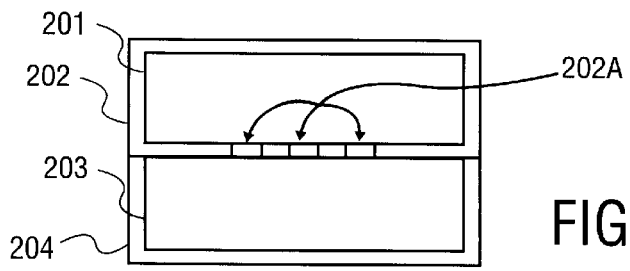

FIG. 2E shows the combined substrates with an additional protective layer 204. Typically, for a silicon substrate, the structure is re-oxidized forming a layer upon the exposed substrate layer (i.e., substrate layer 203). The oxidation process is typically effected upon the entire structure. but adds only negligibly to the previous oxidation layer (i.e., protective layer 202). The protective layer 202 acts as insulation to further oxidation.

Figure 2F:
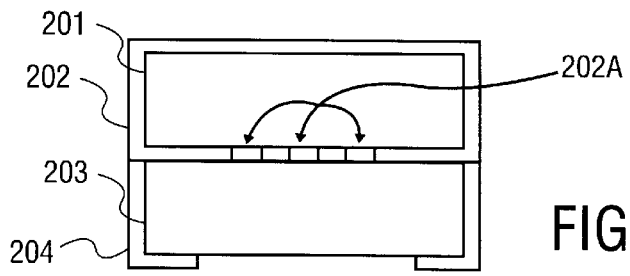

FIG. 2F shows protective layer 204 after a patterning and etching process. This process may be the same as that described above in reference to FIG. 2C or may another patterning and etching process. Some portion of the protective layer 204 has been removed so that etching of the substrate layer 203 can be effected.

Figure 2G:
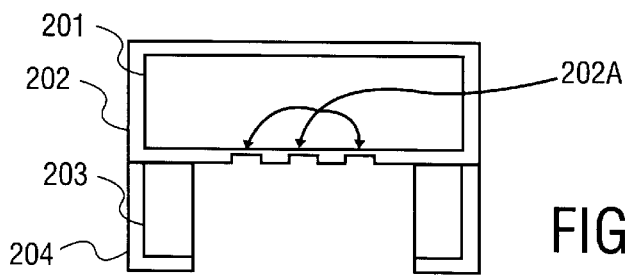

FIG. 2G shows the result of the etching of the substrate layer 203. The directional etching etches vertically down and removes exposed portions of the substrate layer 203. The remaining portion of the protective layer 204 protects that portion of substrate layer 203 that is directly below it. The etching continues until the protective layer 202 is reached. Thin portions 202a act as an etch stop protecting the substrate layer 201. In practice the etching is not uniform, the etching is accelerated in the middle as compared with the edges. When the etch encounters thin portions 202a the etching in that area is stopped while the etching continues at the edges. This results in the uniform etching of substrate layer 203.

Figure 2H:
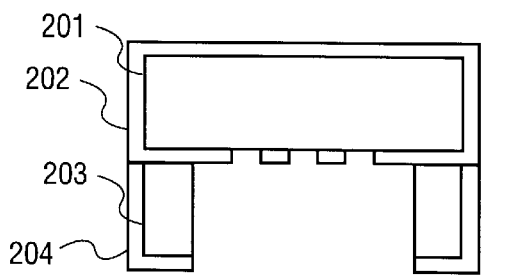

FIG. 2H shows the removal of thin portions 202a of protective layer 202. To remove thin portions 202a, a different etch may be used that can etch the protective layer. For example, an etch is used that can etch silicon dioxide. This etching process may remove some of the exposed patterned portion of protective layer 202 while removing thin portions 202a. At this point the buried patterned surface, as described above in reference to FIG. 2D, is exposed.

Figure 2I:
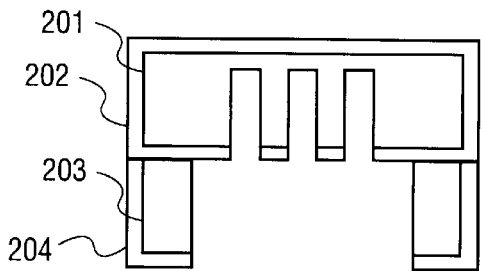

FIG. 2I shows the multiple level structure resulting from a final etching process. This etching process may be the same as that described above in reference to FIG. 2G, or may a different etching process.

Figure 3A:
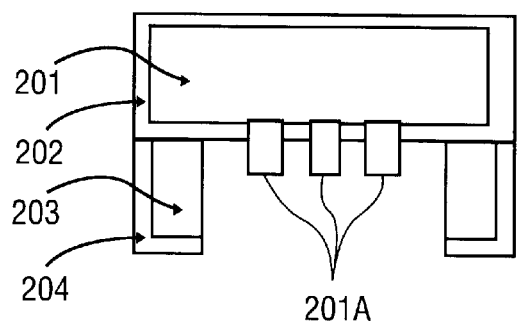
FIGS. 3A through 3C illustrate examples of alternative embodiments of the process of the present invention.

FIGS. 3A though 3C show examples of alternative embodiments of the process of the present invention.

FIG. 3A shows a structure in which the final etching process, described in reference to FIG. 2I is not used to create a multiple level structure. Instead of the final etching process that would etch away exposed portions of substrate layer 201, a process is used to build up the exposed portions of substrate layer 201. The additional material 101a added to substrate layer 101 may be the same as the material of substrate layer 101 or may be another material that adheres to the material of substrate layer 101. For example, if substrate layer 101 is silicon, the additional material 101a may be silicon or a metal such as tungsten that adheres to silicon, but not to silicon dioxide. The additional material 101a may be applied using an electroplating process, an electroless deposition or some other process.

Figure 3B:
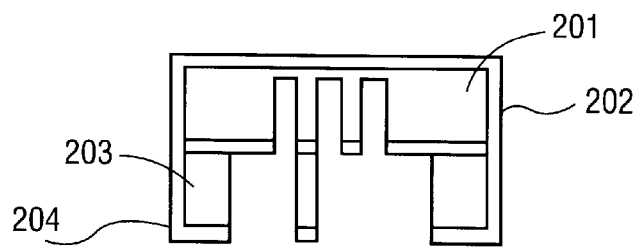

FIG. 3B shows an exemplary structure using a different pattern than the one described in reference to FIG. 2F. This structure illustrates that the patterning process can be varied to form a variety of structure shapes.

Figure 3C:
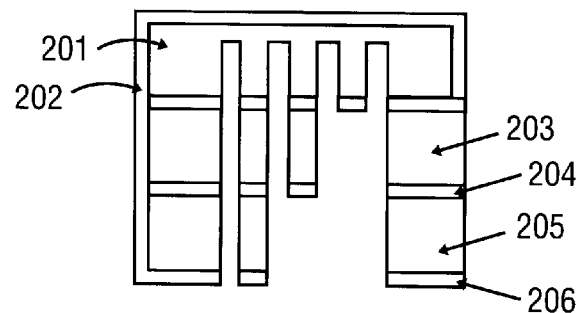

FIG. 3C shows an exemplary structure created by reiterating the process of the present invention and varying the patterns. This structure illustrates that the process may be repeated to create structures having several different heights.

The method of the present invention may be applied to a variety of MEMS devices including micro-fluidic devices, inertial sensors, and RF devices, among others.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:

forming a first protective layer upon a first substrate layer;

selectively patterning the first protective layer such that patterned portions of the first protective layer are reduced;

bonding a second substrate layer to the first protective layer such that a subsurface patterned layer is formed;

forming a second protective layer upon the second substrate layer;

selectively patterning the second protective layer such that portions of the second substrate layer are exposed;

etching the exposed portions of the second substrate layer such that the subsurface patterned layer is exposed;

etching the subsurface patterned layer such that the patterned portions are removed, exposing portions of the first substrate layer; and etching the exposed portions of the first substrate layer such that a multiple-depth structure is formed.

2. A method comprising:

forming a first protective layer upon a first substrate layer;

selectively patterning the first protective layer such that patterned portions of the first protective layer are reduced;

bonding a second substrate layer to the first protective layer such that a subsurface patterned layer is formed;

forming a second protective layer upon the second substrate layer;

selectively patterning the second protective layer such that portions of the second substrate layer are exposed;

etching the exposed portions of the second substrate layer such that the subsurface patterned layer is exposed;

etching the subsurface patterned layer such that the patterned portions are removed, exposing portions of the first substrate layer; and adding material to the exposed portions of the first substrate layer such that a multiple-depth structure is formed.

3. The method of claim 1 wherein the first substrate and the second substrate are silicon wafers.

4. The method of claim 1 wherein the first substrate layer and the second substrate layer are different materials.

5. The method of claim 1 wherein the first substrate and the second substrate are composed of a material selected from the group consisting essentially of a semiconductor, glass, and metal.

6. The method of claim 1 wherein the etching is accomplished through use of an etching process selected from the group consisting of reactive ion etching, wet chemical etching, and laser ablation etching.

7. The method of claim 2 wherein the material is added through a process selected from the group consisting of an electroplating process, an electroless plating process, and a fill and planarize process.

8. The method of claim 7 wherein the first substrate layer is silicon and the material is tungsten.

9. The method of claim 1 wherein the first protective layer and the second protective layer are layers of silicon dioxide.

10. The method of claim 9 wherein the first protective layer and the second protective layer are formed upon the first substrate layer and the second substrate layer, respectively, through an oxidation process.

11. A method comprising:

forming a first protective layer upon a first substrate layer;

selectively patterning the first protective layer such that patterned portions of the protective layer on a top side of the first substrate layer are reduced;

bonding a second substrate layer to the top side of the first substrate layer such that a subsurface patterned layer is formed;

forming a second protective layer upon the second substrate layer;

selectively patterning the first protective,layer on a bottom side of the first substrate layer such that portions of the first substrate layer are exposed;

etching the exposed portions of the first substrate layer such that the subsurface patterned layer is exposed;

etching the subsurface patterned layer such that the patterned portions are removed, exposing portions of the second substrate layer; and etching the exposed portions of the second substrate layer such that a multiple-depth structure is formed.

12. A method comprising:

forming a first protective layer upon a first substrate layer;

selectively patterning the first protective layer such that patterned portions of the first protective layer are reduced;

depositing a second substrate layer to the first protective layer such that a subsurface patterned layer is formed;

forming a second protective layer upon the second substrate layer;

selectively patterning the second protective layer such that portions of the second substrate layer are exposed;

etching the exposed portions of the second substrate layer such that the subsurface patterned layer is exposed;

etching the subsurface patterned layer such that the patterned portions are removed, exposing portions of the first substrate layer; and etching the exposed portions of the first substrate layer such that a multiple-depth structure is formed.

13. A method comprising:
a) forming a protective layer upon a substrate layer;
b) selectively patterning the protective layer such that patterned portions of the protective layer are reduced;
c) bonding another substrate layer to the protective layer such that a subsurface patterned layer is formed;
d) repeating operations a–c as desired;
e) forming a final protective layer upon the final substrate layer;
f) selectively patterning the final protective layer such that portions of the final substrate layer are exposed;
g) etching the exposed portions of the final substrate layer such that a final subsurface patterned layer is exposed;
h) etching the exposed subsurface patterned layer such that the patterned portions are removed, exposing portions of a previous substrate layer;
i) etching the exposed portions of the previous substrate layer such that a previous subsurface patterned layer is exposed; and
repeating operations h–i such that a multiple-depth structure is formed.

* * * * *